United States Patent
Chaintreuil et al.

(10) Patent No.: US 9,389,272 B2
(45) Date of Patent: Jul. 12, 2016

(54) METHOD FOR DETECTING AN ELECTRIC ARC IN A PHOTOVOLTAIC INSTALLATION

(75) Inventors: Nicolas Chaintreuil, Monthelian (FR); Pierre Perichon, Voiron (FR); Sandrine Vallet, Barby (FR)

(73) Assignee: Commissariat a L'energie Atomique et aux Energies Alternatives, Paris (FR)

( * ) Notice: Subject to any disclaimer, the term of this patent is extended or adjusted under 35 U.S.C. 154(b) by 1001 days.

(21) Appl. No.: 13/141,598

(22) PCT Filed: Dec. 21, 2009

(86) PCT No.: PCT/EP2009/067650
§ 371 (c)(1),
(2), (4) Date: Jul. 19, 2011

(87) PCT Pub. No.: WO2010/072717
PCT Pub. Date: Jul. 1, 2010

(65) Prior Publication Data
US 2011/0267721 A1    Nov. 3, 2011

(30) Foreign Application Priority Data
Dec. 22, 2008  (FR) .................................... 08 07432

(51) Int. Cl.
*H02H 3/00* (2006.01)
*H02H 7/00* (2006.01)
(Continued)

(52) U.S. Cl.
CPC ............ *G01R 31/1209* (2013.01); *G01R 31/28* (2013.01); *H01L 31/02021* (2013.01); *H02H 7/20* (2013.01); *H02H 1/0015* (2013.01); *Y02E 10/50* (2013.01)

(58) Field of Classification Search
CPC ........... H01H 9/50; H01H 9/32; H01H 9/542; H01H 33/596; H01H 9/56; H02H 1/0015; H02H 7/20; H02H 1/0023; Y02B 10/12; Y02E 10/50; H01L 31/02021; G01R 31/1209
See application file for complete search history.

(56) References Cited

U.S. PATENT DOCUMENTS

| 6,734,682 B2 * | 5/2004 | Tallman ............... G01R 31/025 324/528 |
| 2008/0049217 A1 * | 2/2008 | Cappelletti ................ 356/141.3 |

(Continued)

FOREIGN PATENT DOCUMENTS

| DE | 38 16 047 A | 4/1988 |
| FR | 2761541 A | 10/1998 |

(Continued)

OTHER PUBLICATIONS

Machine translation of WO 95-25374 A; Inventors Mark et al., Mar. 1995.*

(Continued)

*Primary Examiner* — Rexford Barnie
*Assistant Examiner* — Terrence Willoughby
(74) *Attorney, Agent, or Firm* — Frommer Lawrence & Haug LLP

(57) ABSTRACT

Method for detecting an electric are in a photovoltaic device by ultrasound, comprising measuring at least one parameter among the amplitude, the duration and the central frequency, of an electrical signal received by an ultrasound sensor; and comparing the measurement of this at least one parameter of the electrical signal with predefined values in order to determine whether the measurement corresponds to that of an electric arc.

12 Claims, 3 Drawing Sheets

(51) Int. Cl.
*G01R 31/12* (2006.01)
*G01R 31/28* (2006.01)
*H01L 31/02* (2006.01)
*H02H 7/20* (2006.01)
*H02H 1/00* (2006.01)

(56) References Cited

U.S. PATENT DOCUMENTS

2008/0122369 A1* 5/2008 Nitschke .................. 315/111.21
2008/0147335 A1   6/2008 Adest et al.
2009/0097172 A1* 4/2009 Bremicker et al. ............... 361/8
2012/0174961 A1* 7/2012 Larson et al. ................. 136/246

FOREIGN PATENT DOCUMENTS

FR    2827675 A      1/2003
JP    01-163809 A    6/1989
WO    WO 95/25374 A  9/1995
WO    WO 00/79604 A  12/2000

OTHER PUBLICATIONS

Search report issued by European Patent Office for corresponding application EP 09 793 551.4 dated Jan. 8, 2013.

* cited by examiner

METHOD FOR DETECTING AN ELECTRIC ARC IN A PHOTOVOLTAIC INSTALLATION

This application is a 371 of PCT/EP2009/067650 filed on Dec. 21, 2009, published on Jul. 1, 2010 under publication number WO 2010/072717, which claims priority benefits from French Patent Application Number 08 07432 filed Dec. 22, 2008, the disclosure of which is incorporated herein by reference.

The invention relates to a method for detecting an electric arc in a photovoltaic system, and to a method for safe management of a photovoltaic system. It also relates to a photovoltaic module and to a photovoltaic device, which are equipped with a safety device against the appearance of electric arcs.

Photovoltaic installations operate with high DC voltage and DC current, which leads to risks of the appearance of electric arcs. Such electric arcs may occur following a handling error, for example if an operator inadvertently opens a live connector, or following wear of the connections of the installation. These electric arcs generate a large amount of plasma heat for a significant time since with DC voltage, unlike in an AC system, the value of the voltage is never zero, and for this reason they are very dangerous to individuals and installations. Furthermore, the integration of photovoltaic modules in the roofing of buildings risks starting a fire in the framework in the event of an electric arc.

Photovoltaic installations can be connected to the electrical network by means of an inverter. In such a configuration, there are safety systems for detecting a possible electric arc occurring on the electrical connection between an array of photovoltaic modules and the inverter. However, these systems are insufficient since an electric arc may be produced in a photovoltaic module itself. There is no known safety solution against such a risk.

Document FR 2,827,675 discloses the possibility of detecting an electric arc inside a rigid electrical conductor by adding an ultrasound sensor positioned on this conductor for measuring the sound wave induced by the electric arc on this conductor. This solution is suitable for a rigid metal conductor of a particular conventional electrical circuit. A photovoltaic module comprises a very particular structure confined in protective material is such as glass, in which waves of the ultrasound type do not behave at all as in the case of a simple copper conductor. Furthermore, a photovoltaic module is generally positioned in stressful external environments experiencing all kinds of climatic conditions: wind, rain, cold, heat. For all these reasons, the traditional solutions applied to copper electrical conductors are not applicable to the very specific and different field of photovoltaic installations.

An additional technical problem arises after an electrical incident of the electric arc type has occurred in a photovoltaic installation, which consists in optimizing the maintenance and repair operations which may well prove laborious owing to the large number of equivalent modules and the fact that they are not always positioned in a readily accessible way in such an installation.

Thus, it is a general object of the invention to provide a solution for detecting an electric arc in a photovoltaic installation, in order to improve the safety of such installations.

More precisely, the invention aims to achieve all or some of the following objects:

It is a first object of the invention to provide a solution for detecting an electric arc occurring actually inside a photovoltaic module.

It is a second object of the invention to provide a solution for safeguarding a photovoltaic installation in which an electric arc occurs, in particular by intervening very rapidly in the event that an electric arc is detected.

It is a third object of the invention to provide a solution for facilitating maintenance and repair of a photovoltaic installation which has experienced an electric arc.

To this end, the invention is based on a method for detecting an electric arc in a photovoltaic device by ultrasound, characterized in that it comprises the following steps:
- measuring at least one parameter among the amplitude of the signal, the duration of the signal and the central frequency of the signal, of a signal received by an ultrasound sensor;
- comparing the measurement of this at least one parameter of the signal with predefined values in order to determine whether the measurement corresponds to that of an electric arc.

The second step of comparing the measurement of the at least one parameter with predefined values may comprise the following checks for determining whether the signal is actually generated by an electric arc:
- checking whether the amplitude of the received signal is greater than or equal to 40 dB; and/or
- checking whether the duration of the received signal lies between 15 and 25 µs; and/or
- checking whether the central frequency of the received signal lies between 200 and 360 kHz.

The method for detecting an electric arc by ultrasound may furthermore comprise the following additional step for determining whether the signal is actually generated by an electric arc:
- checking whether the rms voltage of the recorded signal increases from a first value of between 5 and 15 $dB_{EA}$ to a second value of between 15 and 25 $dB_{EA}$.

The invention also relates to a method for safeguarded management of a photovoltaic device, characterized in that it comprises a method for detecting an electric arc by ultrasound as described above, then in that it comprises a step consisting in opening the electrical circuit of the photovoltaic device in the event that an electric arc is detected, in order to extinguish the electric arc.

The method may implement the following additional steps:
- after opening the electrical circuit following the detection of an electric arc, putting the photovoltaic device back into operation at least once;
- if an electric arc is detected again, stopping operation of the photovoltaic device and transmitting information about the malfunction of the photovoltaic device.

The management method may comprise an additional step of locating the electric arc in the photovoltaic device.

This step of locating the electric arc in the photovoltaic device may comprise the following substeps:
- storing the signal reception times for each of the sensors and ranking these sensors in order of reception;
- determining the location of the electric arc as a function of the order of arrival of the signal at each sensor.

Furthermore, the method for safeguarded management of a photovoltaic device may comprise a preliminary step of initiating the electric arc detection method only after the time when the photovoltaic device exceeds a certain electrical production threshold.

The invention also relates to a photovoltaic module, characterized in that it comprises an ultrasound sensor for the detection of electric arcs and a means of communication from this ultrasound sensor to a processing unit.

The ultrasound sensor for the detection of electric arcs is located on the frame or on the glass of the module.

Lastly, the invention also relates to a photovoltaic device comprising photovoltaic modules mounted on one or more chassis, characterized in that it comprises at least one ultrasound sensor for the detection of electric arcs, positioned on a photovoltaic module or a chassis supporting a plurality of photovoltaic modules, and in that it comprises a processing unit carrying out the electric arc detection method described above.

The photovoltaic device may comprise at least one ultrasound sensor per two photovoltaic modules.

The photovoltaic device may comprise a safety device, the function of which is to open the electrical circuit in the event that an electric arc is detected, the photovoltaic device carrying out the safeguarded management method as described above.

The safety device may be positioned on an output terminal of the array of photovoltaic modules of the photovoltaic device or directly at all or some of the photovoltaic modules.

These objects, characteristics and advantages of the present invention will be explained in detail in the following description of a particular embodiment, provided without implying limitation and with reference to the appended figures, in which:

FIG. 1 schematically illustrates a photovoltaic device according to an embodiment of the invention.

Figure 4:
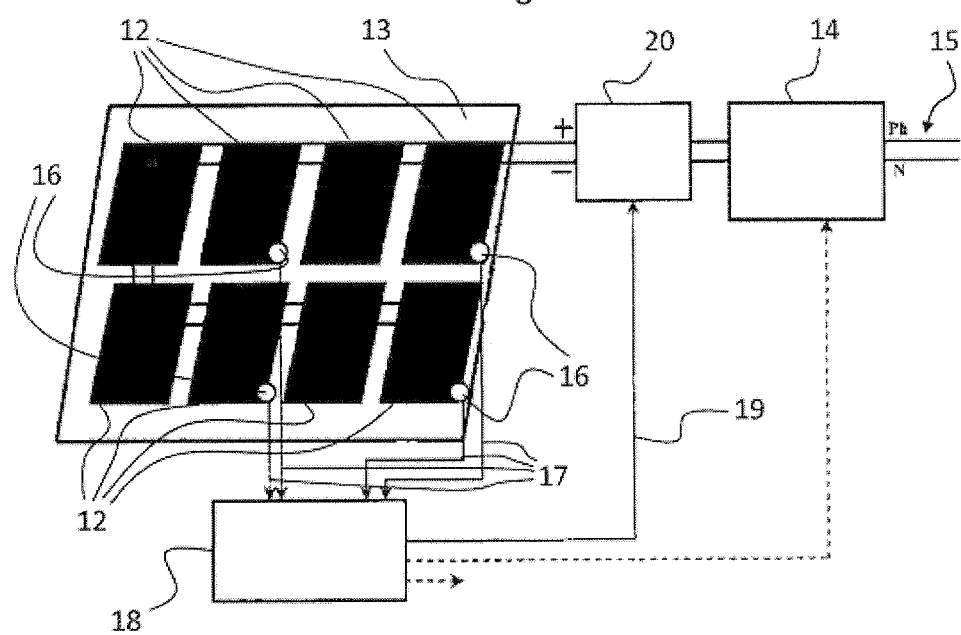

FIG. 4 schematically illustrates a photovoltaic device according to an alternative embodiment of the invention.

Figure 5:
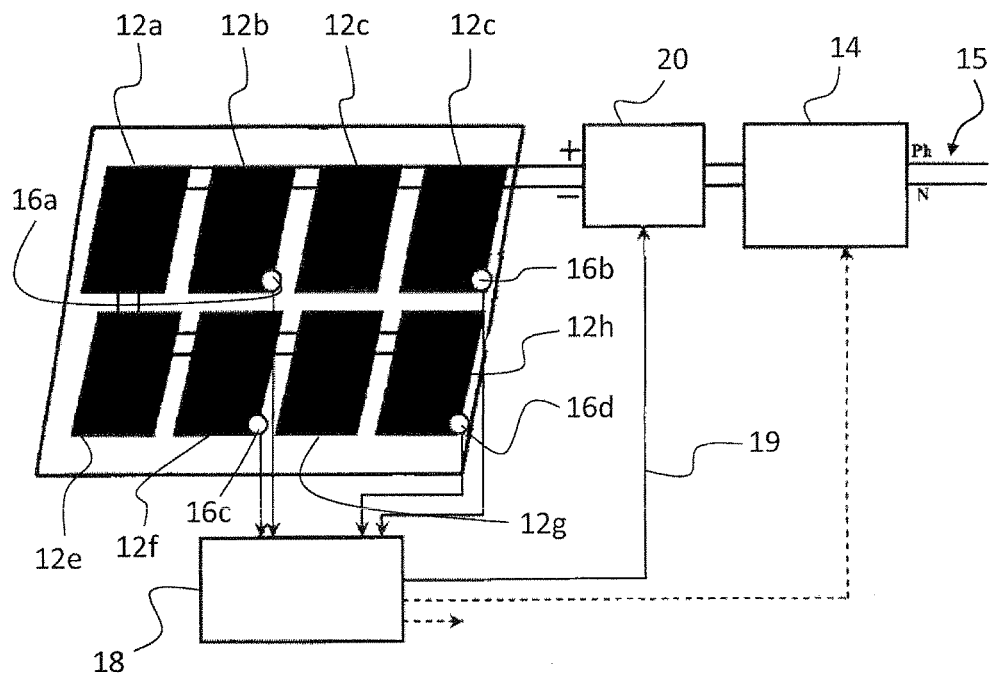

FIG. 5 returns to the preceding diagram in order to illustrate the conduct of a step of the method for safeguarded management of the photovoltaic device according to an embodiment of the invention.

The invention is based on analysing the ultrasound signal emitted by an electric arc inside a confined place constituted by a photovoltaic module and an array of photovoltaic modules, so as to detect and identify the acoustic signature of an electric arc. The concept of the invention therefore consists in using one or more ultrasound sensors positioned at a photovoltaic module, then in defining particular processing of the measurements taken by this sensor or these sensors in order to identify with precision the existence or absence of an electrical arc inside a photovoltaic installation.

Figure 1:
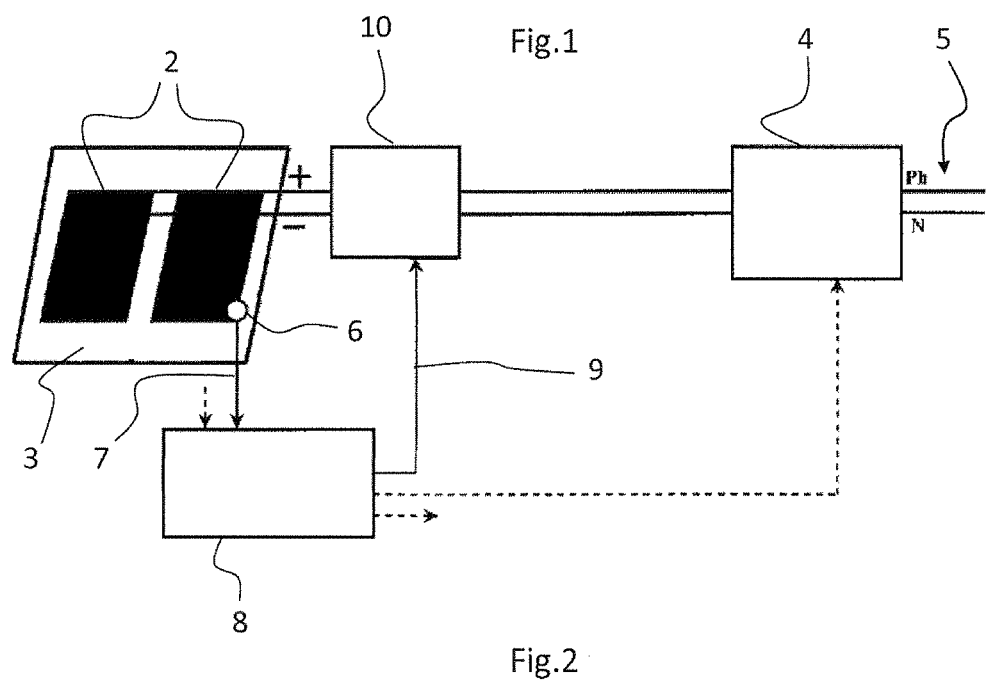

FIG. 1 schematically represents a photovoltaic device according to an embodiment of the invention. This device comprises two photovoltaic modules 2 mounted on a chassis 3 and connected to the traditional electrical network 5 by means of an inverter 4. According to the invention, this device comprises an ultrasound sensor 6 positioned at a photovoltaic module 2 and connected by a communication link 7 to a signal processing unit 8 capable of analysing the data transmitted by the sensor 6. This processing unit 8 is itself connected by a communication means 9 to a safety device 10, the function of which is to open the electrical circuit at the request of the processing unit 8 in the event of an electric arc. These various components of the photovoltaic device are supplied with energy directly by the photovoltaic modules.

According to the embodiment of the invention, the ultrasound sensor 6 is positioned optimally in order to pick up the acoustic waves of the photovoltaic device. It may, for example, be located on the frame or on the glass, or in the connection box of the module. As a variant, it may also be placed on the chassis 3 supporting the modules 2.

The function of the processing unit 8 is to analyse the data received by the ultrasound sensor 6 and to carry out an electric arc detection method, which will be explained in detail below, by hardware and/or software components in analogue or digital fashion. Among the various data transmitted by the sensor, this method makes it possible to recognize those which correspond specifically to the noise emitted by an electric arc, by recognizing the particular acoustic signature of such an electric arc. According to possible embodiments, this processing unit 8 may comprise a plurality of inputs and outputs, in particular an output to the inverter 4 and/or to another component for management of the photovoltaic device or for energy management. It may also comprise a calculation unit, such as a microcontroller, and a memory component for storing the predefined data corresponding to an electric arc.

The electric arc detection method according to the invention will now be described in detail.

First, according to a preliminary step E0, the method is not put into operation, that is to say listening for ultrasound, until after the time when the photovoltaic device exceeds a certain production threshold, for example 10% of its rated power. Below this threshold, the risk of an electric arc does not exist and does not require monitoring.

Figure 2:
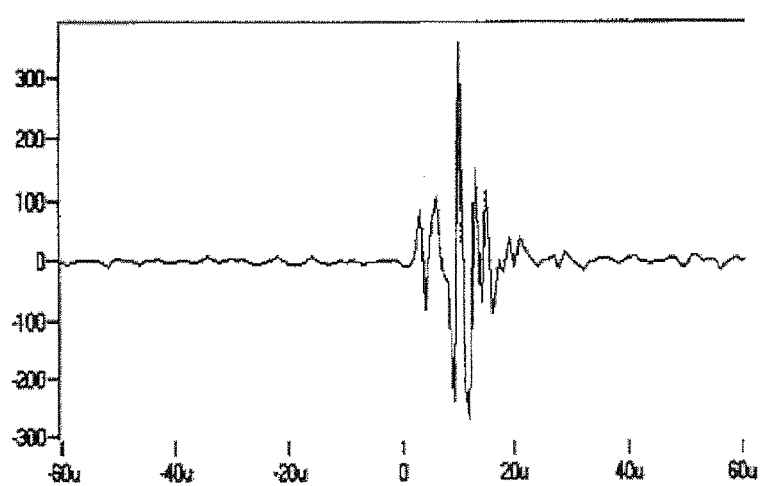
FIG. 2 represents an acoustic wave generated in the photovoltaic device by an electric arc.

The essential step of detecting the acoustic signature of the electric arc consists in comparing the data received by the sensor 6 with the recorded acoustic signature of an electric arc, which is represented in FIG. 2. According to the invention, the wave corresponding to this acoustic signature is characterized by some particular parameters; these parameters can assume values lying in predefined ranges. These parameters are:

the amplitude of the signal, which is greater than or equal to 40 dB; this parameter makes it possible, for example, to carry out a step consisting in not taking all the low-amplitude noise into account;

the duration of the signal, which lies between 15 and 25 µs;

the central frequency of the signal, which lies between 200 and 360 kHz;

the rms voltage of the signal, which increases, generally from 11 $dB_{EA}$ to about 25 $dB_{EA}$. This parameter is secondary with respect to the previous three, and may be used in combination with one or more of the previous three parameters.

Thus, the detection method according to the invention consists in measuring all or some of these parameters in order to check whether they lie in predefined and stored value ranges, which correspond to the values of an electric arc.

The choice of the parameters to be used among the three main ones listed above represents a compromise between the intended precision for the recognition of electric arcs and the desired calculation time. If all the parameters are considered, the electric arc detection may achieve an error rate of close to zero, but carrying out the calculation will however take slightly longer, which will delay the intervention on the circuit. Similarly, the choice of the predefined value ranges for each of these parameters also represents a compromise between the desire to detect as many electric arcs as possible while eliminating as many situations as possible due to a different event, in order to avoid opening the circuit when there is no electric arc.

Figure 3:
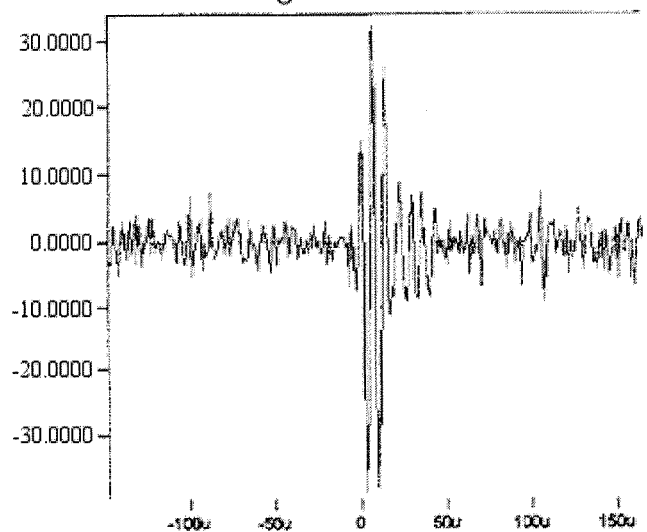
FIG. 3 represents an acoustic wave generated in the photovoltaic device by the thermal expansion of a photovoltaic module.

The detection method employed thus makes it possible to recognize an electric arc with a chosen error rate, among numerous other possible events which also lead to the formation of acoustic waves. This problem is very specific to a photovoltaic installation owing to its external environment, which generates a variety of noise, but also because of its structure which is based on positioning its electrical circuits in confined places and in specific materials, generally glass. For example, the thermal expansion of a photovoltaic module generates noise in the form of crackling, which is also measured by the ultrasound sensor and transmitted to the processing unit. FIG. 3 illustrates the wave measured during such an event. The duration of the burst is generally more than 25 µs. Furthermore, the value of the rms signal of the recorded signal remains constant, and does not increase as in the case of an electric arc. The other main noises encountered at a photovoltaic module are due to rain which generates continuous noise different from the electric arc, apart from the first drops which may cause a thermal shock and expansion phenomena as mentioned above, wind which generates low-amplitude background noise, hail which generates low-energy acoustic waves with a frequency different from that of an electric arc, and external vibrations, for example due to an earthquake, with a frequency much lower than that of an electric arc.

Thus, the electric arc detection method according to the invention will comprise the following two essential steps:

E1—measuring at least one parameter among the amplitude, the duration of the wave and the central frequency, of an acoustic signal received by the sensor;

E2—comparing the measurement of this at least one parameter with stored values in order to determine whether the measurement corresponds to that of an electric arc.

The second step E2 may more precisely comprise the following checks, which make it possible to decide whether the received signal actually corresponds to an electric arc:

E21—checking whether the amplitude is greater than or equal to 40 dB; and/or

E22—checking whether the duration of the signal lies between 15 and 25 µs; and/or E23—checking whether the central frequency lies between 200 and 360 kHz.

It may furthermore comprise the following additional step:

E24—checking whether the rms voltage of the recorded electrical signal increases. Advantageously, a check may be made whether it increases from a first value close to 11 $dB_{EA}$, more generally lying between 5 and 15 $dB_{EA}$, to a second value close to 25 $dB_{EA}$, more generally lying between 15 and 25 $dB_{EA}$.

Lastly, the safety device 10 may either be arranged on one of the terminals at the output of the photovoltaic array, or comprise a device for each photovoltaic module, for example in its connection box. After detection of an electric arc, the processing unit 8 transmits the information and the command to open the electrical circuit to the safety device, which makes it possible to shut off the electric current and stop the electric arc, thus removing the risk represented by sustaining the electric arc, in particular the risk of fire. This safety device may consist of a simple remotely controlled switch.

The invention also relates to the method for safeguarded management of a photovoltaic installation, which implements the electric arc detection method detailed above, then step E3, which consists in opening the electrical circuit in the event that an electric arc is detected, in order to extinguish the electric arc. The method may furthermore implement the following additional steps:

E4—after opening the electrical circuit following the detection of an electric arc, putting the photovoltaic device back into operation at least once;

E5—if an electric arc is detected again, stopping operation and transmitting information about the malfunction of the installation. This information may be transmitted to an operator by means of a warning light, or any appropriate man-machine interface.

FIG. 4 illustrates a photovoltaic device according to an alternative embodiment, which differs from the device described above in that it comprises eight photovoltaic modules 12 and four ultrasound sensors 16. The proportion of one sensor per two modules is preserved and advantageous. However, a different proportion could also be envisaged without departing from the concept of the invention. These various modules are mounted on a substrate 13 and electrically connected to the network 15 via an inverter 14. It is to be noted that the concept of the invention is also well-suited to a photovoltaic installation which is not connected to the network 15, since it is based on local measurements actually at the photovoltaic modules. The ultrasound sensors 16 communicate via links 17 with a processing unit 18, which itself communicates with a safety device 20 via a link 19. The latter components are similar to those described above.

This device operates in a similar way to that described above, and carries out the method for electric arc detection and safe management of the photovoltaic installation which has been explained above. According to a beneficial characteristic, this device implements an additional function of locating an electric arc, which is advantageous in order to improve the maintenance and intervention operations in the event of malfunction, in particular for very extended installations. Such a function can thus make it possible to increase the economic viability and the level of availability of the installation, which is important for example for an electricity production station.

Thus, this device carries out a management method which comprises the additional step E6 consisting in locating the origin of the electric arc in the installation. This step is advantageously carried out based on the information of the time of reception of the electric arc signal by each sensor, which depends on the propagation time of the wave from its site to the sensor and therefore gives an indication of its origin.

The locating step E6 could therefore be broken down into the following substeps:

E61—storing the reception time t0 of the electric arc acoustic wave of the first sensor 16 to receive it, which is used as a reference time for the other sensors;

E62—storing the reception times ti of the acoustic wave for each of the other sensors i and ranking these sensors in order of reception;

E63—determining the location of the electric arc as a function of the order of arrival of the acoustic wave at each sensor 16 of the photovoltaic module 12.

FIG. 5 represents an example of carrying out this method. The various photovoltaic modules of the installation, which corresponds to that of FIG. 4, have been referenced 12a to 12h and the various sensors 16a to 16d. Let us assume that the first sensor receiving the electric arc acoustic wave is the sensor referenced 16a, then the wave reaches the sensors 16b, 16c, 16d in that order. In this case, the electric arc is necessarily located in the photovoltaic module 12c.

The locating method has been given by way of illustration of the invention. Other methods are possible, for example taking into account the exact distances between the various modules and the sensors in order to recover, as a function of the propagation times of the signals, their distance of origin from each sensor then their exact location.

Subsequently, the device may carry out a final step E7 of transmitting the location information to the person in charge of the installation by a man-machine interface positioned at the processing unit 18, for example, or by any other communication means, via the inverter 14 or an energy management centre.

Naturally, the concept of the invention is not limited to the photovoltaic devices described above, but may be carried out in any kind of photovoltaic installation, with numerous photovoltaic modules and different ratios of ultrasound sensors. Nevertheless, the use of at least one sensor per two photovoltaic modules is advantageous.

The application of the invention therefore indeed makes it possible to achieve the intended objects, and furthermore has the following advantages:

- since the ultrasound emission propagates very rapidly in glass (5000 m/s) and reaches the ultrasound sensor in a few milliseconds, the device is capable of cutting the electrical circuit very rapidly;
- the detection of electric arcs, even inside the modules, thus makes it possible to avoid total destruction of a photovoltaic installation by fire;
- the device of the invention still functions effectively even if it is positioned in the vicinity of metal structures, for example on reinforced concrete buildings;
- this solution is of course compatible with and complementary to other solutions for electric arc detection outside photovoltaic modules, and can therefore be combined with these other solutions.

The invention claimed is:

1. A method for detecting an electric arc by ultrasound the method comprising the steps of:
   positioning at least one ultrasound sensor on a photovoltaic module or on a chassis supporting a plurality of photovoltaic modules;
   measuring (E1) at least one parameter among an amplitude, a duration and a central frequency of an electrical signal received by the ultrasound sensor;
   comparing (E2) the measurement of this at least one parameter of the electrical signal with predefined values in order to determine whether the measurement corresponds to that of an electric arc,
   wherein the second step (E2) of comparing the measurement of the at least one parameter with predefined values comprises the following checks for determining whether the electrical signal is actually generated by an electric arc:
      checking (E21) whether the amplitude of the electrical signal is greater than or equal to 40 dB; and/or
      checking (E22) whether the duration of the electrical signal lies between 15 and 25 µs; and/or
      checking (E23) whether the central frequency of the electrical signal lies between 200 and 360 kHz,
   checking (E24) whether rms voltage of the electrical signal increases from a first value of between 5 and 15 $dB_{EA}$ to a second value of between 15 and 25 $dB_{EA}$.

2. The method of claim 1, comprising linking the at least one ultrasound sensor to a processing unit.

3. The method of claim 1, wherein the at least one ultrasound sensor for the detection of electric arcs is located on a frame or on glass of at least one of the plurality of photovoltaic modules.

4. The method of claim 1, wherein the plurality of photovoltaic modules are mounted on one or more chassis.

5. The method of claim 4, wherein there is at least one ultrasound sensor per two photovoltaic modules.

6. A method for safeguarded management of a photovoltaic device, the method comprising the steps of:
   positioning at least one ultrasound sensor on a photovoltaic module or on a chassis supporting a plurality of photovoltaic modules;
   measuring (E1) at least one parameter among an amplitude, a duration and a central frequency of an electrical signal received by the ultrasound sensor;
   comparing (E2) the measurement of this at least one parameter of the electrical signal with predefined values in order to determine whether the measurement corresponds to that of an electric arc,
   wherein the second step (E2) of comparing the measurement of the at least one parameter with predefined values comprises the following checks for determining whether the electrical signal is actually generated by an electric arc:
      checking (E21) whether the amplitude of the electrical signal is greater than or equal to 40 dB; and/or
      checking (E22) whether the duration of the electrical signal lies between 15 and 25 µs; and/or
      checking (E23) whether the central frequency of the electrical signal lies between 200 and 360 kHz;
   opening an electrical circuit (E3) of the photovoltaic device in the event that an electric arc is detected, in order to extinguish the electric arc,
   after opening the electrical circuit following the detection of an electric arc, putting the photovoltaic device back into operation at least once (E4);
   if an electric arc is detected again, stopping operation of the photovoltaic device and transmitting information about the malfunction of the photovoltaic device (E5).

7. The method of claim 6, comprising opening the electrical circuit with a safety device in the event that an electric arc is detected.

8. The method of claim 7, wherein the safety device is positioned on an output terminal of all or some of the plurality of photovoltaic modules.

9. A method for safeguarded management of a photovoltaic device, the method comprising the steps of:
   positioning at least one ultrasound sensor on a photovoltaic module or on a chassis supporting a plurality of photovoltaic modules;
   measuring (E1) at least one parameter among an amplitude, a duration and a central frequency of an electrical signal received by the ultrasound sensor;
   comparing (E2) the measurement of this at least one parameter of the electrical signal with predefined values in order to determine whether the measurement corresponds to that of an electric arc,
   wherein the second step (E2) of comparing the measurement of the at least one parameter with predefined values comprises the following checks for determining whether the electrical signal is actually generated by an electric arc:
      checking (E21) whether the amplitude of the electrical signal is greater than or equal to 40 dB; and/or
      checking (E22) whether the duration of the electrical signal lies between 15 and 25 µs; and/or
      checking (E23) whether the central frequency of the electrical signal lies between 200 and 360 kHz;
   opening an electrical circuit (E3) of the photovoltaic device in the event that an electric arc is detected, in order to extinguish the electric arc,
   locating (E6) the electric arc in the photovoltaic device, the step (E6) of locating the electric arc in the photovoltaic device comprising the following substeps:
      storing reception times (ti) of the electric arc for each of sensors (16$i$) and ranking these sensors in order of reception (E61, E62);

determining the location of the electric arc as a function of the order of arrival of the electric arc at each sensor (16*i*) (E63).

10. A method for safeguarded management of a photovoltaic device according to claim 9, wherein the method comprises a preliminary step (E0) of initiating the electric arc detection method only after the photovoltaic device exceeds a certain electrical production threshold.

11. Method for detecting an electric arc by ultrasound, the method comprising the steps of:
- positioning at least one ultrasound sensor on a photovoltaic module or on a chassis supporting a plurality of photovoltaic modules;
- measuring (E1) at least one parameter among an amplitude, a duration and a central frequency of an electrical signal received by the ultrasound sensor;
- comparing (E2) the measurement of this at least one parameter of the electrical signal with predefined values in order to determine whether the measurement corresponds to that of an electric arc,
- wherein the second step (E2) of comparing the measurement of the at least one parameter with predefined values comprises the following checks for determining whether the electrical signal is actually generated by an electric arc:
- checking (E21) whether the amplitude of the electrical signal is greater than or equal to 40 dB; and
- checking (E23) whether the central frequency of the electrical signal lies between 200 and 360 kHz.

12. The method of claim 11, wherein the second step (E2) further comprises checking (E22) whether the duration of the electrical signal lies between 15 and 25 µs.

\* \* \* \* \*